United States Patent [19]
Misawa et al.

[11] B 3,994,011
[45] Nov. 23, 1976

[54] HIGH WITHSTAND VOLTAGE-SEMICONDUCTOR DEVICE WITH SHALLOW GROOVES BETWEEN SEMICONDUCTOR REGION AND FIELD LIMITING RINGS

[75] Inventors: Yutaka Misawa; Tatsuya Kamei; Takahiro Nagano, all of Hitachi, Japan

[73] Assignee: Hitachi, Ltd., Japan

[22] Filed: June 17, 1974

[21] Appl. No.: 480,292

[44] Published under the second Trial Voluntary Protest Program on March 16, 1976 as document No. B 480,292.

[30] Foreign Application Priority Data
Sept. 3, 1973  Japan.............................. 48-98295

[52] U.S. Cl................................... 357/55; 357/13; 357/34; 357/50; 357/52; 357/53
[51] Int. Cl.²................... B43K 21/02; B43K 21/04; H01L 29/90; H01L 29/72
[58] Field of Search .................. 357/13, 34, 38, 39, 357/49, 50, 52, 53, 55

[56] References Cited
UNITED STATES PATENTS

| | | | |
|---|---|---|---|
| 3,241,010 | 3/1966 | Eddleston ............................ | 357/52 |
| 3,335,296 | 8/1967 | Smart................................... | 357/52 |
| 3,391,287 | 7/1968 | Kao et al. ............................ | 357/52 |
| 3,489,622 | 1/1970 | Barson et al......................... | 357/34 |
| 3,492,174 | 1/1970 | Nakamura et al. .................. | 357/52 |
| 3,555,373 | 1/1971 | Kawana et al. ..................... | 357/52 |
| 3,717,507 | 2/1973 | Abe ..................................... | 357/34 |
| 3,755,001 | 8/1973 | Kooi et al. ........................... | 357/50 |
| 3,755,014 | 8/1973 | Appels et al......................... | 357/50 |

OTHER PUBLICATIONS
J. Appels et al. "Local Oxidation of Silicon and its Application in Semiconductor Device Technology," Philips Res. Repts., vol. 25, (4/70), pp. 118–132.
W. B. French, "Technique for Reducing Surface Leakage and Surface Breakdown in Semiconductor Devices," RCA Tech. Note, No. 919 (10/72) 2 pages.

*Primary Examiner*—Martin H. Edlow
*Assistant Examiner*—Gene M. Munson
*Attorney, Agent, or Firm*—Craig & Antonelli

[57] ABSTRACT

In a semiconductor device which has a semiconductor substrate, a semiconductor region of opposite conductivity type with respect to the substrate and formed in one principal surface of the substrate of the planar type, and a field limiting ring formed in the one principal surface so as to surround the semiconductor region, there is provided a high breakdown voltage-semiconductor device which comprises a concave portion. The concave portion is formed between the semiconductor region and the field limiting ring so that the PN junctions between the semiconductor region and the substrate and between the field limiting ring and the substrate may be exposed to the concave portion. The concave portion is shallower than the semiconductor region and the field limiting ring, and is filled with an insulator material.

13 Claims, 13 Drawing Figures

HIGH WITHSTAND VOLTAGE-SEMICONDUCTOR DEVICE WITH SHALLOW GROOVES BETWEEN SEMICONDUCTOR REGION AND FIELD LIMITING RINGS

BACKGROUND OF THE INVENTION

1. Field of the Invention

The present invention relates to a high breakdown voltage-semiconductor device the principal PN junction of which has a planar configuration.

2. Description of the Prior Art

On the basis of the structure of the PN junction, semiconductor devices are classified into the planar type, the mesa type and the bevel type. The planar type has the configuration in which the termination of each PN junction is exposed to one principal surface of a semiconductor substrate. The mesa type has the configuration in which the termination of a PN junction is exposed to an etched-down surface at the peripheral edge of one principal surface. The bevel type has the structure in which the termination of a PN junction is exposed to a side end surface connecting a pair of principal surfaces with each other, and in which the side end surface intersects with the PN junction at an acute angle in some cases and orthogonally in other cases.

The planar and mesa types are suitable for forming a number of semiconductor substrates from a semiconductor wafer having a large area and, accordingly, they are mainly applied to semiconductor devices of low power. On account of the handling, the bevel type is suitable for a power semiconductor device which has a semiconductor substrate of a large area as compared with those of the planar and mesa types. From the viewpoint of fabrication, the planar type requires only diffusion operations, while the mesa type additionally requires an etching operation. The bevel type involves the bringing of individual devices into the bevel shape. The order of ease of manufacture is the planar type, the mesa type and the bevel type.

On the other hand, since the surface of the semiconductor substrate to which the PN junction is exposed is active and is susceptible to the influence of the atmosphere, it is necessary to stabilize portions at and around the PN junction exposing surface by covering it with an insulator. The insulator covering is called a stabilizing film.

In the planar and mesa type semiconductor devices, the stabilizing film can be formed before dicing the large area semiconductor wafer into the many semiconductor substrates, and the formation of the stabilizing film is excellent.

In contrast thereto, in the bevel type of semiconductor device, the stabilizing film must be formed after dicing. In order to precisely form the stabilizing film on the diced small area semiconductor substrates, high precision techniques and considerable effort are required, so that manufacture of the bevel type is materially inferior to the manufacture of the planar and mesa types.

A discussion will now be presented with respect to the breakdown voltages of the respective types. The bevel type can readily achieve a high breakdown voltage in such a way that the angle of inclination of the side end surface at which the PN junction is exposed is so set as to make (positive bevel) the sectional area of a region of high impurity concentration large by which the region is parallel to the PN junction. Moreover, the angle of inclination is 15°–60° with respect to the PN junction, and the semiconductor substrate will not sharply become large-sized due to the inclination.

The mesa type has a lower in breakdown voltage than the bevel type, because the surface at which the PN junction is exposed has a negative bevel, that is, the inclined surface is such that the sectional area of a region on the high impurity concentration side relative to the PN junction by which the region is parallel to the PN junction becomes small. With the mesa type, a breakdown voltage of nearly 900 (V) is attained. In order to attain a higher breakdown voltage, the angle of inclination at which the PN junction is exposed must be made small. The negative bevel has the nature that, as the angle between the inclined surface and the PN junction or the angle of inclination decreases the breakdown voltage can be increased. For this reason, whereas in a thyristor, a PN junction of positive bevel and a PN junction of negative bevel are provided by inclining the side end surface, the inclination angle of positive bevel and that of negative bevel are different. For positive bevel the inclination is 15° – 60° as mentioned previously, while for negative bevel it is 1° – 2°. Accordingly, if a high breakdown voltage is intended for the mesa type, the angle of inclination must be nearly 1° – 2°, which sharply enlarges the size of the semiconductor substrate with respect to conduction current. Also the breakdown voltage is subject to limitations.

In the planar type, the PN junction has a bent portion at which the field concentration arises. Since the impurity concentrations on both sides of the PN junction at the exposed termination of the PN junction are high, the spread of the depletion layer becomes small at the exposed PN junction. Due to these circumstances, it is difficult to obtain a semiconductor device having a high breakdown voltage. The breakdown voltage attained by the planar type is usually 300–400 volts. If a higher breakdown voltage is intended with the planar type, a region termed a field limiting ring must be formed at the periphery of the exposed PN junction part in a manner to be spaced from the PN junction and to surround it. Enhancement of the breakdown voltage accomplished by one field limiting ring is 300–400 volts, and the number of filed limiting rings is determined in accordance with the desired breakdown voltage. Accordingly, as the breakdown voltage becomes higher, the number of field limiting rings increases, which leads to the disadvantage that the semiconductor substrate sharply becomes large-sized with respect to conduction current.

The PN junction of the planar type is produced in such way that selective diffusion is performed using, as a mask, an oxide film formed on the semiconductor wafer surface. In this regard, it is difficult to form the oxide film perfectly free from pinholes, and portions which are not to be diffused are subjected to diffusion through the pinholes. Where diffusion through the pinholes takes place in the surface between the PN junction and the field limiting ring, the depletion layer does not spread to the field limiting ring and the portion of the diffusion through the pinhole breaks down, so that a desired breakdown voltage cannot be obtained. Further, in the planar type semiconductor device, the oxide film used for the diffusion mask is usually employed as the surface stabilizing film. Therefore, where pinholes exist in the oxide film, the semiconductor device is affected at the pinhole portions by the air and is prone to degrade the breakdown voltage.

In a planar type of semiconductor device which is resin-molded, there is the disadvantage that it is difficult to form a thick oxide film as the surface stabilizing film due to cracks and the necessary precision for mask registration and selective etching. In the device the breakdown voltage of which is 400–500 volts or more, the electric field extends even outside the oxide film due to the thinness of the film. Water having permeated through the resin is ionized by the electric field, and the ions adhere to the surface of the oxide film and create an induced channel in the vicinity of the surface of the semiconductor substrate. The induced channel becomes a cause of the leakage current in the device, and makes it impossible to attain a desired breakdown voltage.

SUMMARY OF THE INVENTION:

An object of the present invention is to provide a novel high breakdown voltage semiconductor device which is free from the various disadvantages stated above.

The high breakdown voltage semiconductor device of the present invention is characterized by a first region which is formed into a planar configuration at a selected portion of one of two principal surfaces of a semiconductor substrate and which has a conductivity type opposite to that of the substrate. At least one annular second region (field limiting ring) surrounds the first region and a concave portion is formed between the first region and the second region, so that the PN junctions between the first and second regions and the substrate region may be exposed thereto and it has a depth smaller than those of the first and second regions; an insulator material fills the concave portion.

In more detail structure comprises a first region of opposite conductivity type relative to a semiconductor substrate, which is provided at a selected area of one principal surface of the substrate and which establishes at least one principal planar PN junction. An annular second region of opposite conductivity type relative to the substrate surrounds the outer periphery of the first region in the one principal surface and which is located within a range within which, when the principal PN junction breaks down, a depletion layer can spread in the one principal surface. Thus, the apparent breakdown voltage of the principle PN junction is increased to a value obtained by adding the breakdown voltage of the PN junction between the second region and the substrate to the breakdown voltage of the principal PN junction. The breakdown voltage of the device is therefore rendered high.

According to the present invention, in such a structure, a concave portion shallower than the first and second regions is formed between these regions in the one principal surface, the principal PN junction and the PN junction between the second region and the substrate are exposed to the concave portion, and the concave portion is filled with an insulator material. Due to the formation of the concave portion, diffusions through the pinholes of an oxide film between the first and second regions can be prevented. Due to the filling of the concave portion with the insulator material, a thick surface stabilizing film free from pinholes can be obtained. The surface stabilizing film can be made thick, and hence, even where the device is resin-molded, an electric field is not applied outside of the surface stabilizing film, so that water permeated through the resin is not polarized. Since the concave portion is shallower than the first and second regions so as not to check the spread of the depletion layer of the principal PN junction, the effect of the formation of the field limiting ring is maintained. Consequently, in accordance with the present invention, it becomes possible to provide a planar type high breakdown voltage semiconductor device which is free from the disadvantages of the prior art.

Further, according to the present invention, the following effects are attained. For one, since the oxide film on the semiconductor substrate surface need not be made thick, formation of electrodes can be readily and precisely effected. As another effect, since the second region is partially left in the one principal surface outside the concave portion which is formed between the first region and the second region, so that the PN junctions between the first and second regions and the substrate region are exposed thereto, any induced channel is intercepted by the part of the second region remaining in the principal surface. Where the concave portion is formed so as not to leave the second region in the principal surface, that is, where a relatively high concentration surface of the second region is hollowed by forming the concave portion, after diffusing an impurity for forming the second region, the impurity concentration of the surface of the second region is decreased, and the generation of the induced channel is possible. When a channel induced in the vicinity of the surface of the second region, the provision of the second region becomes meaningless. By partially leaving the second region in the one principal surface as in the present invention, the influence of the induced channel can be eliminated. This is an important point of the present invention.

A further effect is that the stress of the insulator filled in the concave portion can be made low. Although glass and other inorganic oxides are suitable as the insulator for the surface stabilizing film, they have a large coefficient of thermal expansion as compared with the semiconductor substrate. When the width of the concave portion is large, exfoliation and splitting of the insulator and the bending of the semiconductor substrate are brought about by the stress of the insulator due to thermal contraction. By minimizing the width of the concave portion and partially leaving the second region in the principal surface as in the present invention, the stress of the insulator can be made low. This effect is remarkable where one second region is provided and the concave portion is formed on the outer side thereof, and where a plurality of second regions are provided and the concave portion is formed between the adjacent ones.

The annular second region, herein so termed, need not be a continuous annular region. It suffices that the depletion layer to be formed upon reverse bias becomes a continuous annulus. It is desirable that the concave portion has a continuous annular shape. Furthermore, the present invention is applicable to any of a diode, a transistor, and a thyristor insofar as one of PN junctions offering the function of a semiconductor device is in the planar type relative to the principal surface. Where, in the transistor and thyristor, the PN junctions of the planar type are exposed to both the principal surfaces, it is preferable to form the annular second regions and concave portions in both the principal surfaces.

One of the important features of the present invention is that the interior of the concave portion is filled with insulator material. The filling, herein so termed, means covering the surface of the concave portion with the insulator of a predetermined thickness (which prevents the electric field from leaking and inducing polarization action). Preferably, the thickness is a value which is at least $3\mu$ and which is smaller than the depth of the first and second regions.

Figure 1:
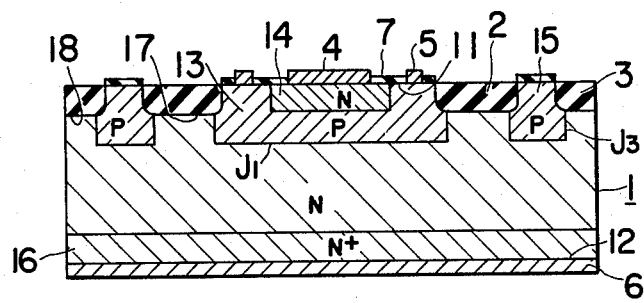
FIGS. 1 and 2 are a sectional view and a plan view showing an embodiment of the high breakdown voltage semiconductor device of the present invention, respectively.
Figure 2:
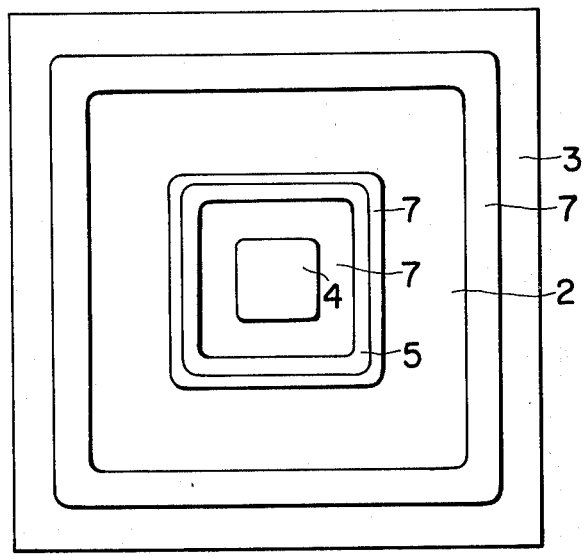

DETAILED DESCRIPTION OF THE INVENTION:

FIGS. 1 and 2 show an NPN transistor to which the present invention is applied. Numeral 1 designates a semiconductor substrate of the N conductivity type. The semiconductor substrate 1 has a pair of principal surfaces which are located on sides opposite to each other. A base region 13 of P conductivity type is formed at a selected area of one principal surface 11 of the semiconductor substrate by, for example, selective diffusion. An emitter region 14 of N conductivity type is formed within the base region 13 by, for example, selective diffusion in such a manner that its surface is exposed to principal surface 11. An annular region 15 of P conductivity type is formed in principal surface 11 so as to surround the base region 13. The annular region 15 acts as a field limiting ring. Shown at 16 is a high impurity concentration layer which is formed on the side of the other principal surface 12. The annular region 15 is provided within a distance within which a depletion layer in the one principal surface at the breakdown of the PN junction $J_1$ established between the substrate region and the base region 13 can spread. Reference numeral 17 indicates an annular concave portion which is formed between the base region 13 and the annular region 15 on the side of principal surface 11. The concave portion 17 is shallower than the base region 13 and the annular region 15, and is so formed that the end part of the PN junction $J_1$ and the end part of the PN junction $J_3$ between the substrate region and the annular region 15 may be exposed to the surface of the concave portion. An annular cutaway portion 18 is formed on the outer peripheral side of the annular region 15 on the side or principal surface 11. The cut-away portion 18 is shallower than the annular region 15, and is so formed that the end part of the PN junction $J_3$ may be exposed to the surface of the cut-away portion. Even when the cut-away portion 18 is a concave portion, the same effect is achieved. Numerals 2 and 3 denote glass which is filled in the concave portion 17 and the cut-away portion, 18 respectively. An emitter electrode 4 and a base electrode 5 respectively are in ohmic contact with the emitter region 14 and the base region 13 in principal surface 11, while a collector electrode 6 is in ohmic contact with the other principal surface 12. An oxide film 7 covers the remaining parts of principal surface 11. With such a construction, the high breakdown voltage semiconductor device (transistor) which achieves the effects previously set forth can be obtained.

Figure 3:
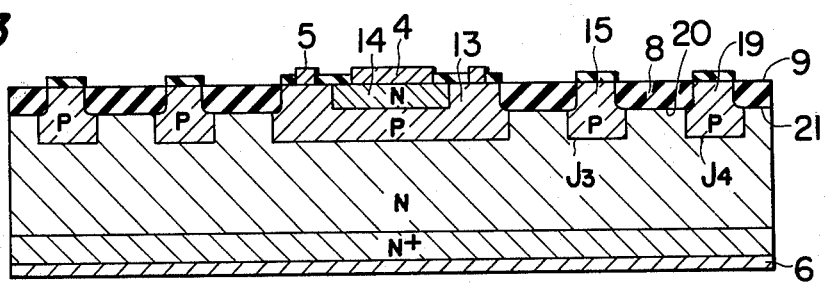
FIGS. 3 and 4 are sectional views each showing another embodiment of the present invention.

FIG. 3 illustrates an embodiment in the case where two annular regions are provided in the NPN transistor shown in FIGS. 1 and 2. In this case, the inner annular region 15 and the base region 13 are spaced by the same distance as in the device of FIGS. 1 and 2. The inner annular region 15 and the outer annular region 19 are spaced by a distance smaller than the dimensions of the depletion layer by which the depletion layer can spread in the one principal surface when the PN junction $J_3$ between the inner annular region 15 and the substrate region breaks down. Between the annular regions in the one principal surface, an annular concave portion 20 is formed which is shallower than both the annular regions and which is so formed that the end part of the PN junction $J_3$ and the end part of the PN junction $J_4$ between the outer annular region 19 and the substrate region may be exposed to the surface thereof. An annular cut-away portion 21 is formed on the outer side of the outer annular region 19. The concave portion 20 and the cut-away portion 21 are filled with glass shown at 8 and 9, respectively.

With such a construction, transistor is provided which achieves the effects previously stated and which has a higher breakdown voltage than the device of FIGS. 1 and 2 by a component corresponding to an increase in the annular region.

Figure 4:
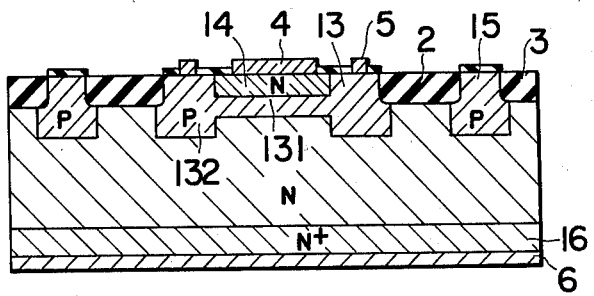

FIG. 4 illustrates an embodiment in the case where the present invention is applied to a high frequency transistor having a high breakdown voltage. It has the same structure as the transistor of FIGS. 1 and 2 except for the shape of the base region 13 The operating speed of the transistor is determined by the thickness of the base region, while the breakdown voltage is determined by the radius of curvature of the bent portion of the PN junction and the impurity concentration in the vicinity of the exposed part. In the embodiment of FIG. 4, the base region 13 has its central portion 131 formed thinly and its peripheral part 132 thickly. Thus, both criteria high breakdown voltage and for high speed are satisfied.

Figure 5A:
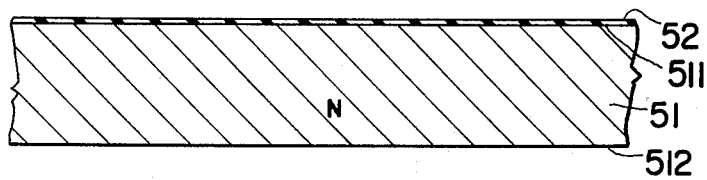
FIGS. 5a to 5h are diagrams showing the manufacturing steps of the device of the present invention.
Figure 5B:
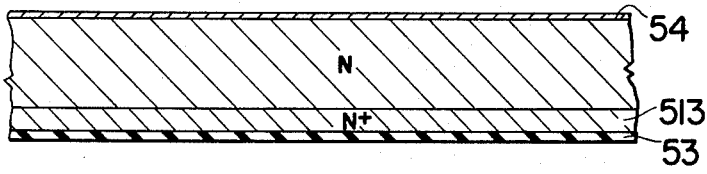
Figure 5C:
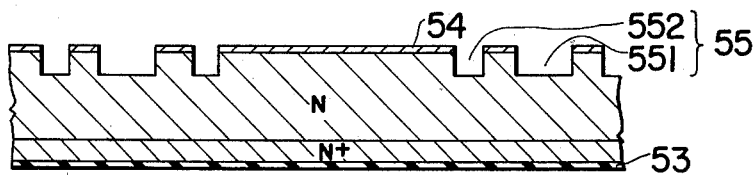

The method of manufacturing the high breakdown voltage semiconductor device of the present invention will now be explained. FIGS. 5a to 5h are diagrams of the manufacturing steps of a diode in accordance with the present invention. In manufacturing the high breakdown voltage diode, a large-area semiconductor wafer 51 having, for example, N conductivity type is prepared. In one surface 511 of the wafer 51, an oxide film 52 is formed (FIG. 5a). Thereafter, the other surface 512 has an impurity such as phosphorus diffused therein to form a high concentration layer 513. Subsequently, with oxide film 53 provided on the other surface, the one surface has boron, for example, diffused therein and shallowly at high concentration (FIG. 5b). The diffused high concentration layer is usually termed a predeposition layer 54. After forming the predeposition layer 54, the one surface is selectively formed with concave portions 55 by, for example, etching (FIG. 5c). The concave portions include, for example, portion 551 which divides the semiconductor wafer into a plurality of lattice-like regions and at least one annular part 552 which surrounds the divided region. In this case, the depth of the concave portions is made at least to the extent that the predeposition layer can be removed.

Figure 5D:
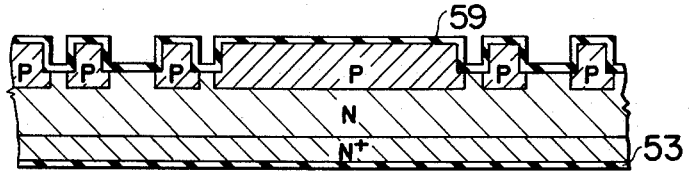

Subsequently, the semiconductor wafer is heated in an atmosphere in which no conductivity type determining impurity is present. In this way, the impurity of the predeposition layer left is subjected to drive-in diffusion into the semiconductor wafer. The depth of the diffusion increases and becomes larger than the depth of the concave portion 55. Thus, within each region of the semiconductor wafer divided by the concave portions 551, there are formed a part which has the function of the diode and a field limiting ring part which surrounds the function part (FIG. 5d).

Figure 5E:
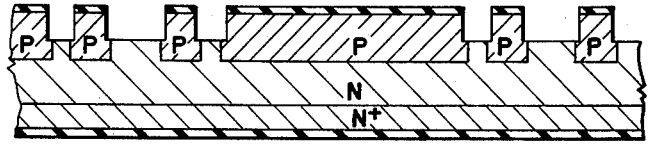

An oxide film 59, which is formed on the one surface during drive-in diffusion, is removed only at parts corresponding to the concave portions (FIG. 5e).

Figure 5F:
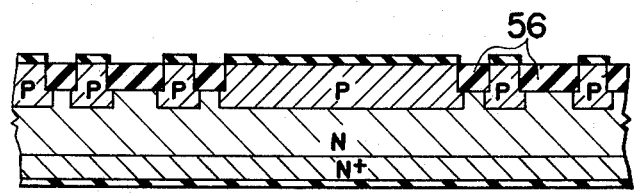
Figure 5G:
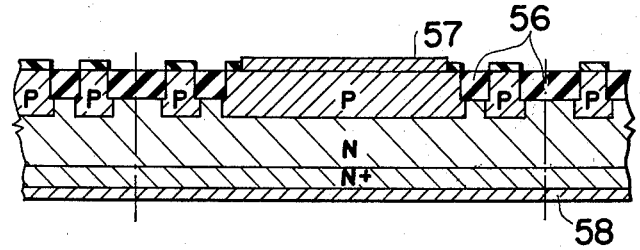
Figure 5H:
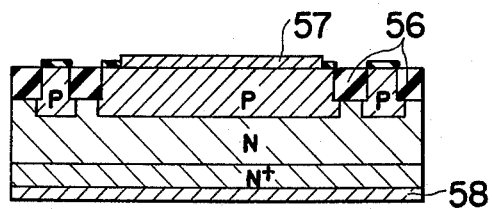

Glass powder is deposited in the concave portions by, for example, an electrophoresis process. It is baked to form glass 56 as a surface stabilizing film (FIG. 5f). Thereafter, anode electrodes 57 and cathode electrodes 58 are attached to selected areas of both surfaces of the semiconductor wafer (FIG. 5g). By cutting the wafer along the one-dot chain lines, a high breakdown voltage diode as shown in FIG. 5h is obtained.

According to this method, after predeposition, the concave protions are formed, and drive-in diffusion is carried out. Therefore, as compared with the method in which the planar type junctions are formed beforehand by selective diffusion and the concave portions are thereafter formed, the above method has the effect that the process steps for selective diffusion and for forming a selective diffusion mask associated therewith can be reduced. If, however, such effect is not expected, the device of the present invention can be fabricated by various methods with conventional semiconductor techniques.

The present invention will now be explained with numerical values given as a suitable example.

Figure 6:
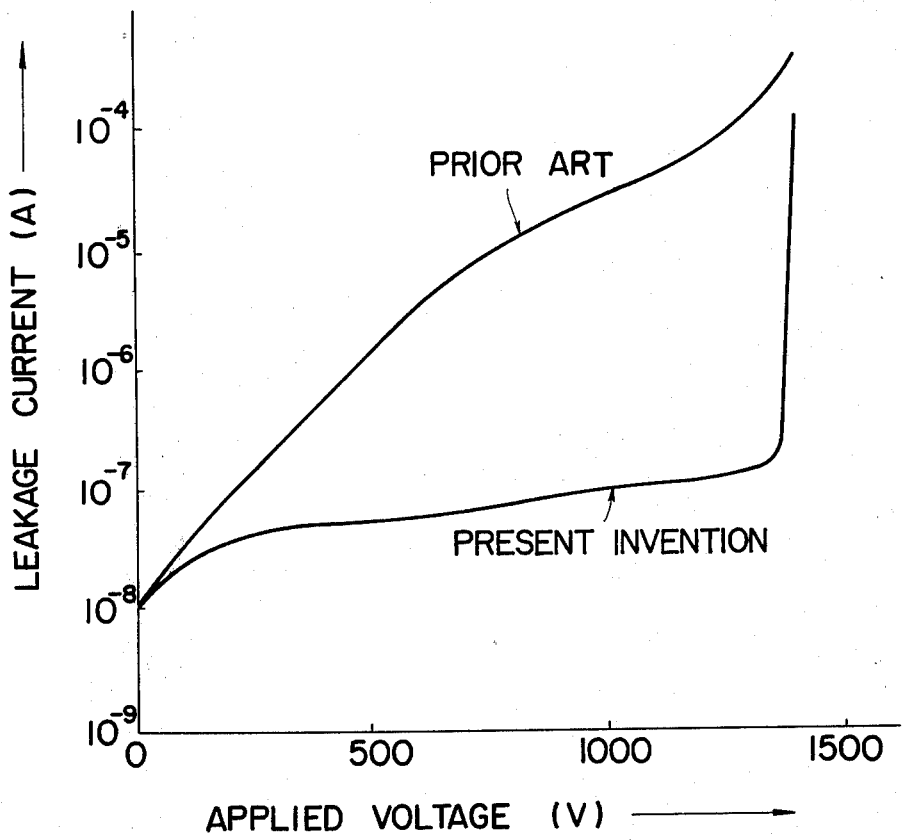
FIG. 6 is a characteristic curve diagram showing the relationship between the applied voltage and the leakage current.

In a prior art diode rated at 1200 V and 3A, the size of the semiconductor substrate was 5.4 mm × 5.4 mm, the depth of the principal PN junction, which may lie in a range of from $10\mu$ to $50\mu$, was $45\mu$, the width and depth of the annular region, which may respectively lie in the ranges of 50 to $150\mu$ and 10 to $50\mu$, were $130\mu$ and $45\mu$, respectively, and the separation between the principal PN junction and the annular region was $45\mu$. In the deivce of the present invention, the concave portion may have a width in the range of 30 to $150\mu$ and a depth in the range of 3 to $30\mu$. In this example a concave portion $120\mu$ wide and $20\mu$ deep was provided between the principal PN junction and the annular region of the diode, and the glass covering $20\mu$ thick was formed in the concave portion. The maximum value of the width of the concave portion is determined by the spreading length of a depletion layer from the PN junction, while that of the depth is determined by the mechanical strength of the semiconductor substrate. The leakage currents of the prior art device and the device of the present invention were compared, and the results are shown in FIG. 6. The prior art planar type element is affected by moisture of the $SiO_2$ surface, etc., so that the leakage current is high and that the characteristic is soft. Assuming that the allowable leakage current of the elements is $10\mu A$, the breakdown voltage is 750V for the prior art element and 1300V for the element of the present invention. Therefore, the element of the invention has a sharply higher breakdown voltage.

We claim:
1. A high breakdown voltage semiconductor device comprising:
   a semiconductor substrate of a first conductivity type having first and second principal surfaces located on opposite sides of said substrate, said substrate having a first depression extending from said first principal surface to a first prescribed depth into said substrate and surrounding a first surface portion of said first principal surface;
   a first semiconductor region of a second conductivity type, opposite said first conductivity type, formed in said first surface portion of said first principal surface, extending into said substrate to a second prescribed depth greater than said first prescribed depth, and defining, with said substrate, a first PN junction which terminates in said depression;
   means for increasing the breakdown voltage of said first PN junction comprising a second semiconductor region of said second conductivity type formed in a second surface portion of said first principal surface, extending to a third prescribed depth greater than said first prescribed depth, surrounding said depression, and defining with said substrate a second PN junction, one end of which terminates in said depression and is spaced apart from said first PN junction within a range over which a depletion layer can spread from said first PN junction in said substrate when said first PN junction breaks down; and
   insulator material disposed on the surface of said depression.

2. A high breakdown voltage semiconductor device according to claim 1, wherein said first PN junction and said one end of said second PN junction terminate at the bottom of said depression.

3. A high breakdown voltage semiconductor device according to claim 1, wherein said insulator material fills said depression.

4. A high breakdown voltage semiconductor device according to claim 3, wherein said insulator material is glass.

5. A high breakdown voltage semiconductor device according to claim 1, wherein said substrate further comprises a second depression extending from said first principal surface to a fourth prescribed depth into said substrate less than said third prescribed depth and surrounding said second surface portion of said first principal surface, with the other end of said second PN junction terminating in said second depression, and wherein said second depression has insulator material disposed on the surface thereof.

6. A high breakdown voltage semiconductor device according to claim 5, wherein each of said first and second depressions is filled with insulator material.

7. A high breakdown voltage semiconductor device according to claim 5, wherein said substrate further comprises further means for increasing the breakdown voltage of said first PN junction comprising a third semiconductor region of said second conductivity type formed in a third surface portion of said first principal surface extending to a fifth prescribed depth greater than said fourth prescribed depth, surrounding said second depression, and defining with said substrate, a third PN junction, one end of which terminates in said second depression.

8. A high breakdown voltage semiconductor device according to claim 7, wherein said second, third and fifth prescribed depths are substantially the same and said first and fourth prescribed depths are substantially the same.

9. A high breakdown voltage semiconductor device according to claim 1, wherein said first depression and said second semiconductor region are substantially annular in shape.

10. A high breakdown voltage semiconductor device according to claim 1, further comprising a third semiconductor region of said first conductivity type formed in a surface portion of said first semiconductor region.

11. A high breakdown voltage semiconductor device according to claim 10, wherein the depth of the portion of said first semiconductor region beneath said third semiconductor region is less than the depth of the remaining portion of said first semiconductor region.

12. A high breakdown voltage semiconductor device according to claim 1, wherein the depth of said first depression is on the order of $20\mu$.

13. A high breakdown voltage semiconductor device according to claim 12, wherein the width of said first depression is on the order of $120\mu$.

* * * * *